United States Patent [19]

Turner

[11] 4,433,247
[45] Feb. 21, 1984

[54] BEAM SHARING METHOD AND APPARATUS FOR ION IMPLANTATION

[75] Inventor: Norman L. Turner, Gloucester, Mass.

[73] Assignee: Varian Associates, Inc., Palo Alto, Calif.

[21] Appl. No.: 306,056

[22] Filed: Sep. 28, 1981

[51] Int. Cl.³ ............................................. G01N 23/00
[52] U.S. Cl. .................................. 250/492.2; 250/398
[58] Field of Search ................... 250/492.2, 398, 443.1

[56] References Cited

U.S. PATENT DOCUMENTS

| | | | |
|---|---|---|---|
| 3,778,626 | 12/1973 | Robertson | 250/492.2 |
| 4,021,675 | 5/1977 | Shifrin | 250/492.2 |
| 4,261,762 | 4/1981 | King | 148/1.5 |
| 4,276,477 | 6/1981 | Enge | 250/398 |
| 4,282,924 | 8/1981 | Faretra | 165/80 |
| 4,283,631 | 8/1981 | Turner | 250/492.3 |

FOREIGN PATENT DOCUMENTS 55-79865  6/1980  Japan.

Primary Examiner—Bruce C. Anderson
Attorney, Agent, or Firm—Stanley Z. Cole; William R. McClellan

[57] ABSTRACT

In an ion implantation system, wafer heating is reduced without significantly reducing wafer throughput. An ion beam is time shared between two or more target positions in the system. The ion beam repeatedly is deflected to each target position for a time interval which is small in comparison with the thermal time constant of the wafer as mounted in the system. During each time interval, the beam is scanned in a two-dimensional pattern over the surface area of the wafer. An integral number of scan patterns is completed during each time interval so as to insure uniform dosage of the wafer. It is preferred that the time interval be less than five percent of the thermal time constant of the wafer when mounted in the ion implantation system.

5 Claims, 5 Drawing Figures

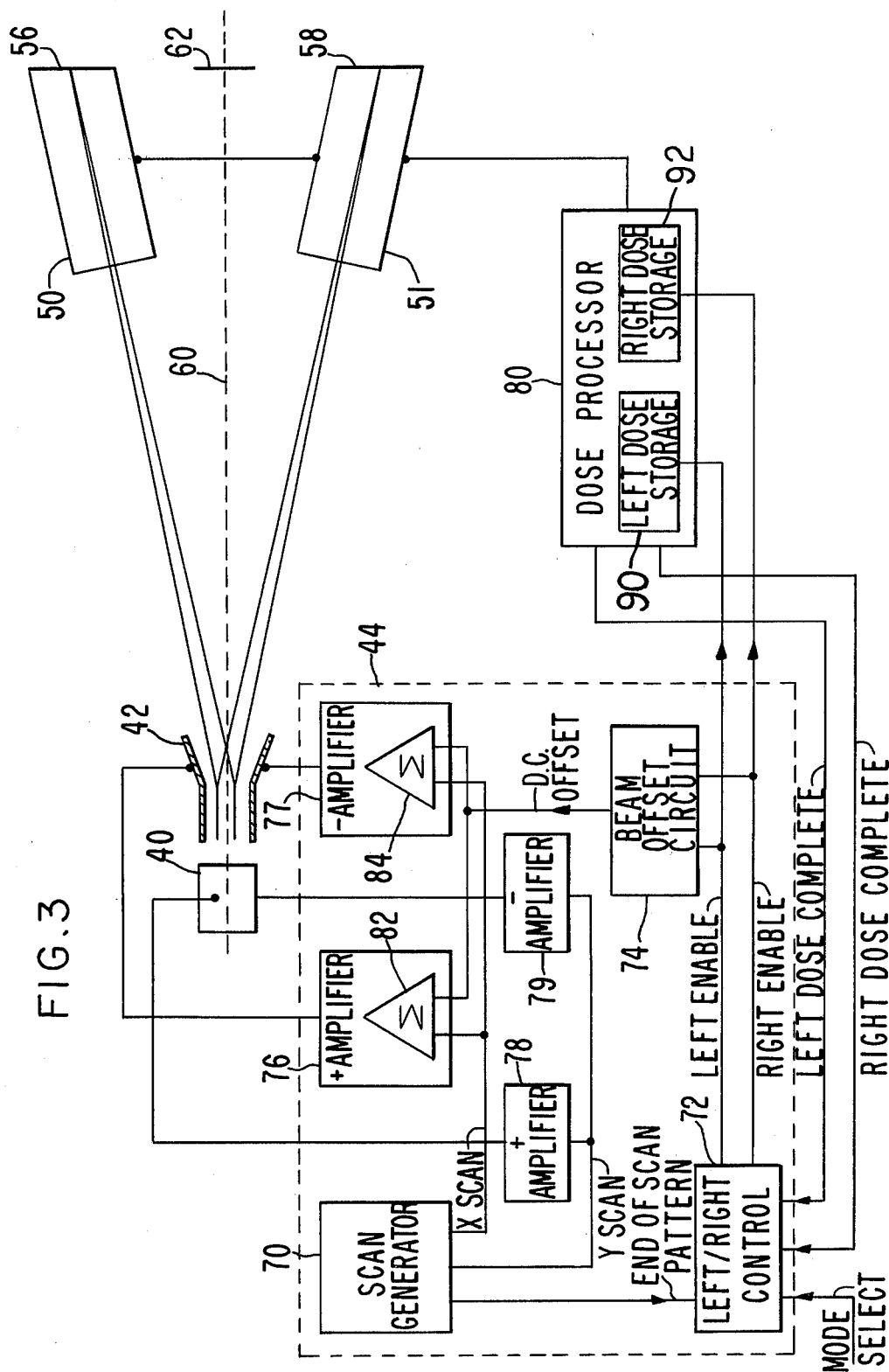

BEAM SHARING METHOD AND APPARATUS FOR ION IMPLANTATION

BACKGROUND OF THE INVENTION

This invention relates to energy beam processing of a workpiece and, more particularly, relates to the application of high energy beams onto silicon wafers in a semiconductor processing system.

In the fabrication of integrated circuits, a number of processes have been established which involve the application of high energy beams onto silicon wafers. These processes include ion implantation, ion beam milling and reactive ion etching. In each instance a beam of ions is generated in a source and directed with varying degrees of acceleration towards a target.

In commercial semiconductor processing one of the major objectives is to achieve a high throughput in terms of wafers processed per unit time. One of the ways to achieve high throughput in an ion beam system is to utilize a relatively high power beam. Associated with the use of a high power beam, however, is the problem of wafer heating. Photoresist, which is commonly present on the wafer surface during processing, has a melting point of about 135° C. Thus, the wafer cannot be permitted to reach 135° C. during processing.

As a consequence, most industrial equipment which is capable of producing high beam power processes wafers in a batch in order to spread the incident power over a large area and to reduce the heating in any given target. A batch processing system involving mechanical movement of the wafers during implantation is disclosed in U.S. Pat. No. 3,778,626 issued Dec. 11, 1973 to Robertson. A batch processing system which utilizes a dual end station to improve throughput is disclosed in U.S. Pat. No. 4,276,477 issued June 30, 1981 to Enge. Batch processing systems are generally large to accommodate the batches and are generally used only for high dose implantations. In addition, throughput is less than optimum because of the time required to manually change batches.

Conductive cooling has also been used to alleviate the problem of wafer heating. For example, wafers are placed in thermal contact with cooled metal platens. Wafers also have been pressed against pliable thermally conductive polymers to enhance thermal contact as disclosed in U.S. Pat. No. 4,282,924, issued Aug. 11, 1981 to Faretra. Another approach has been to introduce a gas behind a wafer in order to permit conduction between the backside of the wafer and the cooled support surface as disclosed in U.S. Pat. No. 4,261,762, issued Apr. 14, 1981 to King. Centrifugal forces have also been used to press wafers against cooled surfaces as disclosed in pending application Ser. No. 284,915, filed July 20, 1981 and assigned to the assignee of the present application. These approaches require elaborate hardware and coolant feedthroughs, do not always provide the desired level of cooling and generally reduce wafer throughput.

It is, therefore, an object of the present invention to provide an ion implantation method and apparatus wherein a beam is time-shared among semiconductor wafers by beam scanning rather than by mechanical movement of the wafers.

It is an additional object of the present invention to provide a method and apparatus for reducing semiconductor wafer heating during high energy beam implantation.

It is yet another object of the present invention to provide an ion implantation method and apparatus which permits a single wafer in one target position to be processed at one time in alternation with wafers in other target positions.

SUMMARY OF THE INVENTION

According to the present invention, these and other objects and advantages are achieved in an apparatus for ion implantation of at least two workpieces mounted in fixed positions in the apparatus during ion implantation. The apparatus comprises means for production of an ion beam having a straight segment with a longitudinal axis and ion beam scanning means. The ion beam scanning means includes means for successively and repetitively directing the ion beam from the longitudinal axis to each workpiece for a predetermined time interval which is small in comparison with the thermal time constant of each workpiece when mounted in the apparatus. The ion beam scanning means further includes means for deflecting the beam during each of the time intervals in a two-dimensional scan pattern over the surface area of the workpiece to which the beam is directed. Each workpiece is implanted on a time-shared basis and the heating of each workpiece is less than that produced when the workpiece is implanted on a continuous basis.

According to another aspect of the present invention, there is provided a method for ion beam irradiation of workpieces mounted in fixed positions in an ion beam apparatus of the type including means for production of an ion beam having a straight segment with a longitudinal axis. The ion beam is deflected from the longitudinal axis so as to irradiate a first workpiece for a first time interval which is small in comparison with the thermal time constant of the first workpiece when mounted in the apparatus. Next the ion beam is deflected from the longitudinal axis so as to irradiate a second workpiece for a second time interval which is small in comparison with the thermal time constant of the second workpiece when mounted in the apparatus. The above-recited steps are repeated until completion of the ion beam irradiation process.

BRIEF DESCRIPTION OF THE DRAWINGS

For a better understanding of the present invention together with other and further objects, advantages and capabilities thereof, reference may be had to the accompanying drawings which are incorporated herein by reference and in which:

FIG. 3 is a schematic diagram of apparatus for beam scanning in accordance with the present invention;

DETAILED DESCRIPTION OF THE INVENTION

Figure 1:
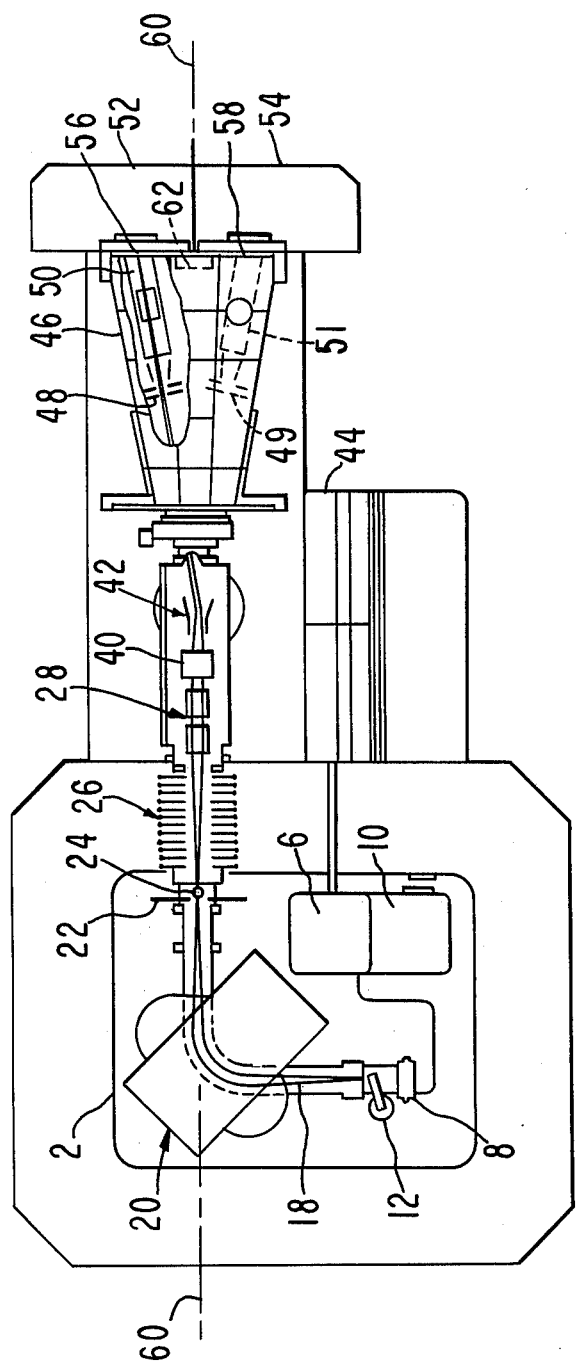
FIG. 1 is a simplified schematic diagram of an ion implantation apparatus in accordance with the present invention.

An ion implantation apparatus in accordance with the present invention is illustrated in FIG. 1. A high voltage terminal 2 is held at high potential relative to ground by a high voltage power supply (not shown). The terminal 2 houses the apparatus required to form a beam of ions of desired species. In common practice a gaseous feedstock of the desired species is employed. A source gas produced from a gas handling system 6 is directed to an ion source 8. A typical ion source 8 required a power supply 10 to sustain an ionizing discharge, a source magnet 12 to impose an axial magnetic field across the discharge region and an extraction electrode (not shown) to shape the electric field at the aperture of the source 8 for effective removal of a well-defined high current ion beam 18. Ion source techniques are generally known in the art. The ion beam 18 diverging from the ion source 8 is mass momentum analyzed and focused by an analyzer magnet 20, which is energized from an analyzer power supply (not shown). The analyzed beam passes through a resolving aperture 22 and a variable slit 24 and then through an acceleration tube 26 where it encounters a carefully designed field gradient from the high voltage terminal 2 to ground potential. Optical elements, such as a quadrupole lens 28, operate to produce a spatial-energy focus at a desired image plane. Y-scan plates 40 and x-scan plates 42 provide electrostatic deflection which directs the beam 18 over the area of the image plane. The waveforms applied to the respective deflection plates and their synchronization to form the appropriate scanning program are generated by a scanning system 44 which is described in more detail hereinafter.

A dual target chamber 46 includes a housing, beam defining masks 48, 49, and Faraday cages 50, 51 for beam monitoring. Automatic wafer handling systems 52, 54 introduce semiconductor wafers one at a time into the vacuum system in target positions 56, 58, respectively, align the same with respect to the target plane, provide cooling of the wafers during implantation and remove the wafers from the vacuum system after implantation is complete. The target positions 56, 58 are typically displaced horizontally on opposite sides of the longitudinal axis 60 of the undeflected beam 18 such as to require a beam deflection of about $\pm 7°$ from the longitudinal axis for scanning of the target positions 56, 58. A beam dump 62 is located on the longitudinal axis 60 in the target chamber 46 and intercepts the neutral portion of ion beam 18 when the beam 18 is directed to one of the target positions 56, 58. When neither of the target positions 56, 58 is being scanned, the charged particle beam is directed to the beam dump 62.

While vacuum pumping apparatus and the vacuum envelope are not shown, it is to be understood that the entire region traversed by the beam is maintained at high vacuum.

Figure 2:
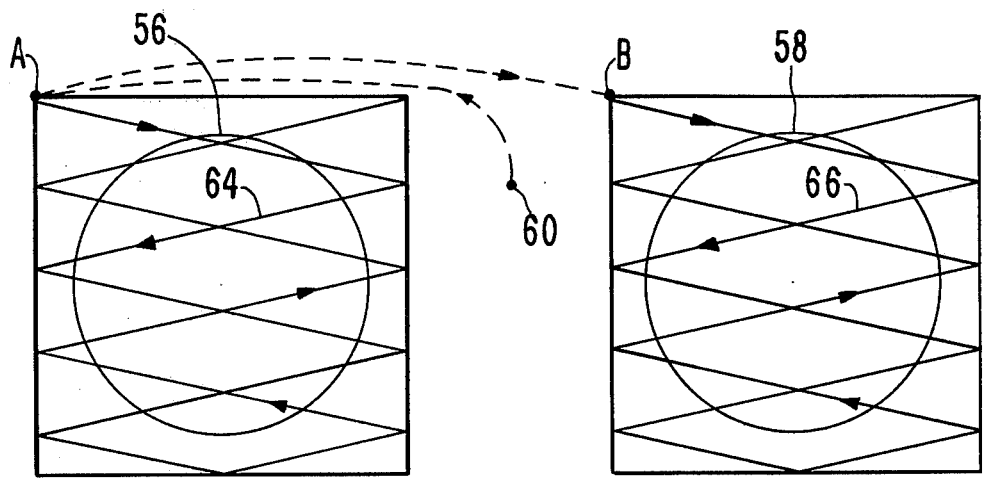
FIG. 2 is a pictorial representation of two target positions showing a simplified scan pattern according to the present invention.

The beam scanning pattern employed by the ion implantation apparatus of FIG. 1 is illustrated in simplified form in FIG. 2. FIG. 2 shows the target positions 56, 58 as viewed from the longitudinal axis 60 of the ion beam 18. The ion beam 18 is scanned over the target positions 56, 58 by application of the appropriate voltages to the y-scan plates 40 and the x-scan plates 42. The beam is directed to a point A associated with the target position 56 and then is scanned in a two-dimensional pattern 64 over the area of target position 56. When one or more patterns 64 are completed, the ion beam is directed to a point B associated with the target position 58 and then is scanned in a two-dimensional pattern 66 over the area of the target position 58. When one or more patterns 66 are completed, the ion beam is directed back to point A and the process is repeated. The modes of operation utilized in connection with this general scanning pattern are described hereinafter.

While any desired pattern 64, 66 can be employed in connection with the present invention, it is extremely important in commercial semiconductor wafer processing to maintain a high degree of uniformity of ion dosage over the surface of the wafer. A suitable scanning pattern and apparatus for generating the pattern are disclosed in U.S. Pat. No. 4,283,631, issued Aug. 11, 1981 to Turner. The scan pattern disclosed therein employs modulation of the scan rate to compensate for nonuniform ion dosage. In addition, the scan pattern employs multiple two-dimensional Lissajous figures, each displaced from the previous figure by a small amount to result in uniform coverage of the target area.

The ion implantation apparatus shown in FIG. 1 can be operated in several scanning modes. In a serial mode, a wafer mounted in target position 56 is implanted continuously until the desired dosage is reached. Then a wafer mounted in target position 58 is implanted continuously until the desired dosage for that wafer is achieved. While target position 58 is being scanned, a new wafer is mounted in target position 56, thereby eliminating lost implant time associated with changing of wafers and increasing throughput. In the serial mode, the wafer is heated continuously during ion implantation.

In a beam sharing mode, the ion beam is timeshared between the target positions 56 and 58 so as to reduce wafer heating for a given beam power. A wafer mounted in target position 56 is implanted in a two-dimensional scan pattern for a time interval t, which is small in comparison with the thermal time constant of the wafer when mounted in the target position 56. The thermal time constant of the wafer is taken in conjunction with any wafer cooling which is provided at the target position. Next, a wafer mounted in target position 58 is implanted in a two-dimensional scan pattern for a time interval $t_2$ which is small in comparison with the thermal time constant of the wafer when mounted in the target position 58. Then the ion beam is directed to target position 56 and the wafer is again implanted for a time interval $t_1$. The process, that is, alternating the ion beam between the target positions 56 and 58 for time intervals $t_1$ and $t_2$ respectively, is repeated until the desired ion dosage for each wafer is reached. In practice, it is desirable to synchronize the start and finish of the time intervals $t_1$ and $t_2$ to the two-dimensional scan pattern so as to complete an integral number of scan patterns during each of the time intervals $t_1$ and $t_2$. Thus, uniform dosage over the area of each wafer is insured.

Apparatus for providing ion beam scanning in both of the above-described modes of operation is shown in schematic form in FIG. 3. The scanning system 44 includes a scan generator 70 which generates the ac waveforms for a two-dimensional scan pattern, a left/right control 72 which determines the target position, if any, to be scanned and a beam offset circuit 74 which provides an appropriate dc offset voltage to direct the ion beam to one of the target positions 56, 58 or the beam dump 62. The scanning system 44 further includes a + amplifier 76 and a − amplifier 77 to drive x-scan plates 42 and a + amplifier 78 and a − amplifier 79 to drive the y-scan plates 40. A dose processor 80 operates in conjunction with the scanning system 44 to provide accurate measurement of the ion dosage to wafers in each target position 56, 58 and to halt scanning of a wafer when the desired dosage is reached.

The scan generator 70, which can be of the type disclosed in U.S. Pat. No. 4,283,631, has an ac X SCAN output coupled to summing amplifiers 82 and 84 located in amplifiers 76 and 77, respectively. A Y SCAN output of the scan generator 70 is coupled through amplifiers 78, 79 to the y-scan plates 40. As described in the above-reference patent, a scan pattern, or frame, requires approximately 98.13 milliseconds to complete. Upon completion of each scan pattern, an END OF SCAN PATTERN pulse is provided to the left/right control 72.

The left/right control 72 provides LEFT and RIGHT ENABLE outputs. When the LEFT ENABLE output is true, the target position 56 is scanned. When the RIGHT ENABLE output is true, the target position 58 is scanned. When neither the LEFT nor RIGHT ENABLE output is true, the beam is directed to the beam dump 62. The LEFT and RIGHT ENABLE outputs are coupled to the beam offset circuit 74 and to the dose processor 80, which is a beam current integrator.

The operation of the left/right control 72 is described with reference to the selected mode of operation. In the beam sharing mode, the left/right control 72 counts a predetermined number of END OF SCAN PATTERN pulses and then switches the ion beam to the opposite target position. For example, when the scan pattern requires 98.13 milliseconds and 10 END OF SCAN PATTERN pulses are counted, the beam remains in each target position for 981.3 milliseconds, or approximately one second. The wafer heating for a beam sharing program of one second on and one second off is described hereinafter. Separate LEFT and RIGHT DOSE COMPLETE signals from the dose processor 80 gate the corresponding LEFT and RIGHT ENABLE outputs off after the desired ion dose is reached. When one wafer is completed before the other, the ion beam is shared between the uncompleted target position and the beam dump 62.

In the serial mode of operation, the LEFT and RIGHT ENABLE outputs are controlled by the LEFT and RIGHT DOSE COMPLETE signals. For example, when the LEFT ENABLE output is true, ion implantation of target position 56 continues until the LEFT DOSE COMPLETE signal becomes true. At this time, the LEFT ENABLE output is inhibited, the RIGHT ENABLE output goes true and ion implantation of target position 58 continues until the RIGHT DOSE COMPLETE signal becomes true. In the serial mode of operation, the ion beam can be directed to one wafer continuously for up to several minutes. Clearly, the apparatus can also be operated in a mode in which one or the other target position is always scanned.

The beam offset circuit 74 provides to the summing amplifiers 82, 84 a DC OFFSET voltage corresponding to the angle between the longitudinal axis 60 of the ion beam and the selected target position. For example, when the target positions 56 and 58 are located horizontally at equal and opposite angles from the longitudinal axis 60, the DC OFFSET voltage is of equal magnitude and opposite polarity for the two positions. A zero DC OFFSET voltage directs the beam to the beam dump 62. After summing the X SCAN and the DC OFFSET voltages, the amplifiers 76, 77 generate composite high voltage signals of equal and opposite polarity to drive the x-scan plates 42 and cause electrostatic deflection of the ion beam in the horizontal direction. Similarly, the voltages applied to the y-scan plates 40 cause deflection of the ion beam in the vertical direction. The drive signals for the y-scan plates 40 do not require a dc offset voltage unless the target positions are displaced vertically from the longitudinal axis 60.

Figure 4:
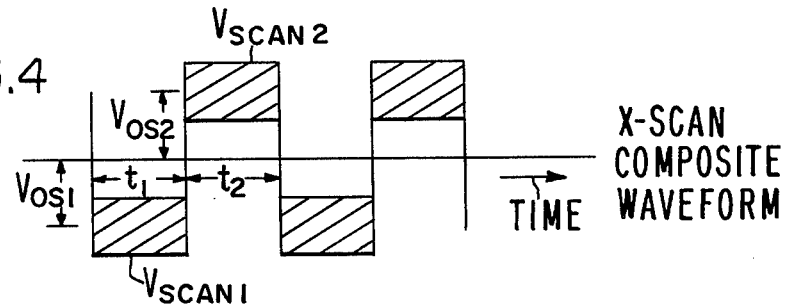
FIG. 4 is a plot of voltage versus time illustrating the composite waveform applied to the x-scan deflection plates in accordance with the present invention.

A typical x-scan composite waveform illustrating DC OFFSET voltages $V_{OS1}$ and $V_{OS2}$, ac X SCAN voltages $V_{SCAN1}$ and $V_{SCAN2}$ and time intervals $t_1$ and $t_2$, is shown in FIG. 4. The ac X SCAN voltages $V_{SCAN1}$ and $V_{SCAN2}$ are indicated by crosshatching because the time scales of $V_{SCAN1}$ and $V_{SCAN2}$ are typically much shorter than $t_1$ and $t_2$. In the general case, $V_{OS1}$ and $V_{OS2}$ are not necessarily equal and $t_1$ and $t_2$ are not necessarily equal. Furthermore, $V_{SCAN1}$ and $V_{SCAN2}$ can be different scan patterns and different in amplitude.

Dose processors, or current integrators, in general, are known and control the implanted dose by measuring the ion beam current on the target position during the implant and integrating the measured value to determine the ion dose. The Faraday cages 50 and 51 which are associated with the target positions 56 and 58, respectively, are coupled to each other and to the dose processor 80 so as to measure ion beam current directed at either target position. The dose processor 80 of the present invention includes a left dose storage element 90 and a right dose storage element 92 for separate measurement of the ion doses supplied to the target positions 56, 58. The LEFT and RIGHT ENABLE outputs of the left/right control 72 enable storage of the integrated dose information in storage element 90 or 92 depending on which target position is being scanned. The dose processor continuously compares the measured ion dose value with the ion dose value preselected by the operator of the apparatus. When either of the measured values equals the preselected value, the corresponding LEFT or RIGHT DOSE COMPLETE output becomes true and inhibits further scanning of that target position. Usually, the preselected doses are reached on both wafers at the same time unless an interruption or variation of the ion beam occurred during implantation.

As noted herein above, when the disclosed apparatus is operated in the beam sharing mode, wafer heating is reduced in comparison with the heating which occurs when the wafer is scanned on a continuous basis. This can be understood by considering the average power applied to the semiconductor wafer in the beam sharing mode. When the ion beam is shared between two wafers for equal time intervals, as described herein above, the beam is on each wafer only half of the time. Thus, the average beam power applied to each wafer is one half of the average power applied in the serial mode. Consequently, the wafer heating is reduced.

Figure 5:
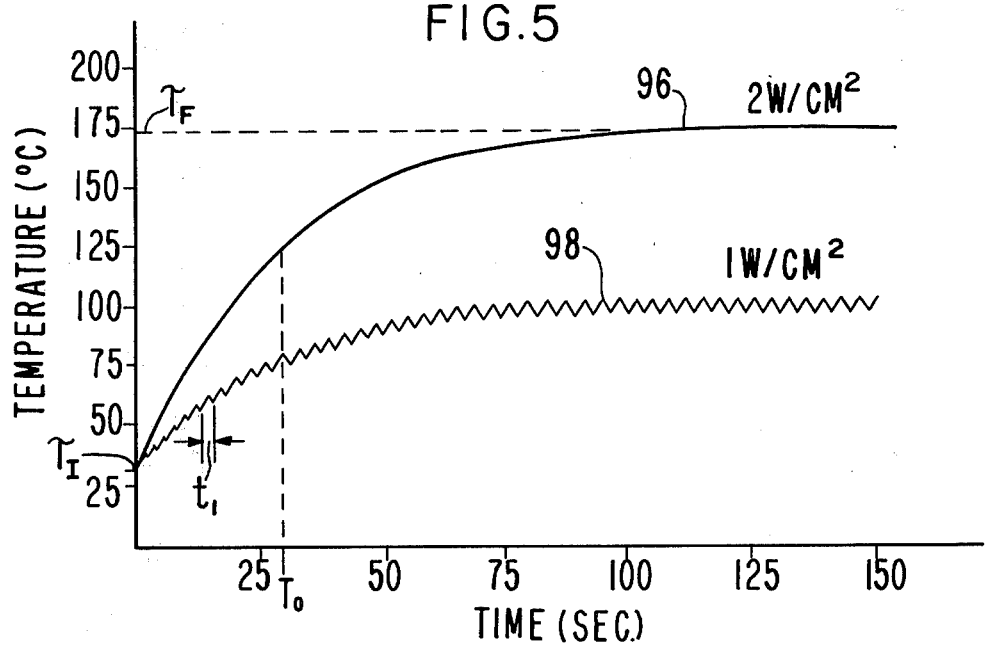
FIG. 5 is a plot of wafer temperature versus time illustrating the reduction in wafer heating in accordance with the present invention.

For this reduction in wafer heating to occur, the time interval for scanning each wafer must be small in comparison with the thermal time constant of the wafer as mounted in the target position. As shown by curve 96 in FIG. 5, each wafer experiences an exponential temperature rise upon the application of beam power. The thehrmal time constant $T_0$ of the wafer is a characteristic of the wafer and any associated cooling provided by the system. It is defined as the time required for the wafer to reach $(1-e^{-1})(\tau_F-\tau_I)$, or $0.63(\tau_F-\tau_I)$, where $T_F$ is the final wafer temperature and $T_I$ is the initial wafer temperature. Typical thermal time constants of silicon wafers mounted in an ion implantation machine equipped with wafer cooling are in the range of 30 seconds to 50 seconds. Examples of heating curves of a silicon wafer with and without beam sharing are shown in FIG. 5 in which wafer temperature is plotted as a function of time. Curve 96 illustrates the heating curve of a wafer when 2 watts/cm$^2$ is applied on a continuous basis in the serial mode. A temperature rise of approximately 150° C., to 175° C., occurs. Curve 98 illustrates the heating curve of a wafer when the same ion beam is applied in the beam sharing mode and the time interval $t_1$ of beam scanning is small compared with the thermal constant $T_0$ of the wafer as mounted. The heating curve is equivalent to that produced by a 1 watt/cm$^2$ beam and the temperature rise is approximately 75°, to 100° C. The jagged appearance of the curve 98 is caused by the periodic application of power, $t_1$ seconds on $-t_1$ seconds off, which results in alternate heating and cooling of the wafer.

The time interval $t_1$ associated with beam sharing should be less than 10% of the thermal time constant $T_0$ and is preferably less than 5% of the thermal time constant $T_0$ in order to minimize the temperature rise of the wafer during the time interval $t_1$. It has been determined that a time interval $t_1$ of about one second is suitable in many applications. Thus, the ion beam is applied to the wafer in a one second on-one second off cycle. Since the ion beam is switched between two target positions in the beam sharing mode, thus resulting in continuous utilization of the ion beam, the wafer heating problem is alleviated without a corresponding loss in throughput. Since the ion beam can be switched rapidly between targets, the switching time does not contribute significantly to total wafer processing time.

As an alternative to reducing the temperature increase of the wafer for a given beam power, the beam sharing mode can be utilized to increase the applied beam power without exceeding a given temperature. Thus, for example, with reference to FIG. 5 the beam power is doubled from 2 watts/cm$^2$ to 4 watts/cm$^2$, wafers implanted in the beam sharing mode generally follow the curve 96 and the power is doubled without exceeding the previous maximum temperature (175° C. in the example of FIG. 5).

It will be understood by those skilled in the art that the beam sharing method of the present invention can be applied to broad, non-scanned ion beams as well as to scanned ion beams. For example, reactive ion etch systems utilize an ion beam which irradiates the entire surface of a semiconductor wafer. Broad ion beams can be alternately deflected to two or more wafers for time intervals which are small in comparison with the thermal time constant of the wafer as mounted in the system, thereby achieving the above-described advantages of reduced wafer heating.

Thus, there is provided by the present invention an ion implantation apparatus wherein, for a given beam power, the temperature increase of the wafer during ion implantation is significantly reduced without a corresponding decrease in system throughput. In addition, there is provided an ion implantation apparatus wherein the ion beam power can be doubled without a corresponding increase in maximum wafer temperature during ion implantation.

While there has been shown and described what is at present considered the preferred embodiments of the invention, it will be obvious to those skilled in the art that various changes and modifications may be made therein without departing from the scope of the invention as defined by the appended claims.

What is claimed is:

1. Apparatus for ion implantation of at least two workpieces mounted in fixed positions in said apparatus during ion implantation, said apparatus comprising:
    means for production of an ion beam having a straight segment with a longitudinal axis;
    ion beam scanning means comprising
        means for successively and repetitively directing said beam from said longitudinal axis to each workpiece for a predetermined time interval which is small in comparison with the thermal time constant of each workpiece when mounted in said apparatus,
        means for deflecting said beam during each of said time intervals in a two-dimensional scan pattern over the surface area of the one of said workpieces to which said beam is directed, and
        means for synchronizing said scan pattern to said time interval such that an integral number of scan patterns is completed during each time interval; and
    means for individually measuring ion beam dosage of each workpiece and for discontinuation of ion beam scanning when a predetermined ion beam dosage is measured,
    whereby the temperature rise of each workpiece is less than that produced when said workpiece is implanted on a continuous basis and the ion beam dosage applied to each workpiece is uniform over the surface area of the workpiece and is accurately controlled.

2. The apparatus as defined in claim 1 wherein said apparatus includes means for mounting of two workpieces displaced from said longitudinal axis and a beam dump on said longitudinal axis and wherein said means for directing said beam to each workpiece includes means for applying an electric field to said beam.

3. The apparatus as defined in claim 2 wherein said predetermined time interval is less than 10 percent of the thermal time constant of each workpiece when mounted in said apparatus.

4. A method for ion beam irradiation of workpieces mounted in fixed positions in an ion beam apparatus, said apparatus being of the type including means for production of an ion beam having a straight segment with a longitudinal axis, said method comprising the steps of:
    deflecting said ion beam from said longitudinal axis so as to irradiate a first one of said workpieces for a first time interval which is small in comparison with the thermal time constant of said first workpiece when mounted in said apparatus;
    scanning said ion beam in a first two dimensional scan pattern over the surface area of said first workpiece an integral number of times during said first time interval;
    deflecting said ion beam from said longitudinal axis so as to irradiate a second one of said workpieces for a second time interval which is small in comparison with the thermal time constant of said second workpiece when mounted in said apparatus;
    scanning said ion beam in a second two dimensional scan pattern over the surface area of said second workpiece an integral number of times during said second time interval;

individually measuring the ion beam dosage of each workpiece discontinuing the ion beam scanning when a predetermined ion beam dosage is measured; and repeating the above-recited steps until a predetermined ion beam dosage has been applied to each workpiece which is accurately controlled.

5. The method as defined in claim 4 wherein said first and second time intervals are each less than ten percent of the thermal time constant of the respective workpiece when mounted in said apparatus.

* * * * *